United States Patent
Lee et al.

(10) Patent No.: US 9,083,397 B2
(45) Date of Patent: Jul. 14, 2015

(54) ANALOG/DIGITAL MODULATION APPARATUS AND METHOD FOR CONTROLLING THE SAME

(75) Inventors: Jong-Woo Lee, Yongin-si (KR); Si-Bum Jun, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/128,869

(22) PCT Filed: Jun. 21, 2012

(86) PCT No.: PCT/KR2012/004899
§ 371 (c)(1),
(2), (4) Date: Dec. 23, 2013

(87) PCT Pub. No.: WO2012/177059
PCT Pub. Date: Dec. 27, 2012

(65) Prior Publication Data
US 2014/0133600 A1 May 15, 2014

(30) Foreign Application Priority Data
Jun. 21, 2011 (KR) ........................ 10-2011-0060063

(51) Int. Cl.
*H04B 7/10* (2006.01)
*H04L 1/02* (2006.01)
(Continued)

(52) U.S. Cl.
CPC ................. *H04B 1/04* (2013.01); *H03M 3/394* (2013.01); *H03M 3/414* (2013.01); *H03M 3/454* (2013.01)

(58) Field of Classification Search
USPC ......................................................... 375/247
See application file for complete search history.

(56) References Cited

U.S. PATENT DOCUMENTS

| | | |
|---|---|---|
| 7,760,122 B1 | 7/2010 | Zortea |
| 2005/0267546 A1* | 12/2005 | Parramon et al. ................ 607/48 |
| 2006/0079788 A1* | 4/2006 | Anderson et al. ............. 600/471 |

(Continued)

FOREIGN PATENT DOCUMENTS

WO  91-05409 A2  4/1991

OTHER PUBLICATIONS

Morgado et al.; Reconfiguration of Cascade /spl Sigma//spl Delta/ Modulators for Multistandard GSM/Bluetooth/ UMTS/WLAN Transceivers; May 21, 2006; Instituto de Microelectronica de Sevilla—IMSE-CMN (CSIC); XP032458100; IEEE; Spain.

(Continued)

*Primary Examiner* — Tanmay Shah
(74) *Attorney, Agent, or Firm* — Jefferson IP Law, LLP

(57) ABSTRACT

An Analog/Digital (A/D) modulation apparatus in a communication system supporting multiple communication modes and a method for controlling the same are provided. The A/D modulation apparatus includes an A/D modulation module having a structure in which a plurality of unit loops are extended by a serial connection, a control module configured to determine a modulation resolution needed for a communication mode to be used, a signal transfer control module including an input control module configured to transfer or block an intermediate output signal of a basic loop, as an input signal of an extended loop serially connected to the basic loop, in response to the modulation control bits provided from the control module, and an output module configured to generate a final digital-modulated signal based on a final output signal of the basic loop and a final output signal of the extended loop.

20 Claims, 5 Drawing Sheets

(51) Int. Cl.
 *H04B 1/04* (2006.01)
 *H03M 3/00* (2006.01)

(56) References Cited

U.S. PATENT DOCUMENTS

2007/0236966 A1* 10/2007 Uruno et al. .................... 363/20
2008/0129565 A1* 6/2008 Gustat et al. ................. 341/143
2010/0156376 A1* 6/2010 Fu et al. ........................ 323/283

OTHER PUBLICATIONS

De La Rosa et al.; Adaptive CMOS Analog Circuits for 4G Mobile Terminals—Review and State-of-the-Art Survey; Jan. 31, 2009; Microelectronics Journal 40 (2009) 156-176; XP025841050; Elsevier; Spain.

* cited by examiner

ANALOG/DIGITAL MODULATION APPARATUS AND METHOD FOR CONTROLLING THE SAME

CROSS-REFERENCE TO RELATED APPLICATION(S)

This application is a U.S. National Stage application under 35 U.S.C. §371 of an International application filed on Jun. 21, 2012 and assigned application number PCT/KR2012/004899, which claimed the benefit of a Korean patent application filed on Jun. 21, 2011 in the Korean Intellectual Property Office and assigned Serial number 10-2011-0060063, the entire disclosure of which is hereby incorporated by reference.

TECHNICAL FIELD

The present disclosure relates generally to an Analog/Digital (A/D) modulation apparatus and a method for controlling the same. More particularly, the present disclosure relates to an A/D modulation apparatus in a communication system supporting multiple communication modes, and a method for controlling the same.

BACKGROUND

The development and growth of the wireless communication industry has made wireless communication environments in which various wireless communication technologies coexist. Wireless communication technologies, which have been commercialized, or which are expected to be commercialized in the near future, such as wireless communication standards, may include $2^{nd}$-Generation (2G), $3^{rd}$-Generation (3G) and $4^{th}$-Generation (4G) communication technologies. The 2G communication technology may be a Global System for Mobile communication (GSM) technology, the 3G communication technology may be an Enhanced Data rates for GSM Environment (EDGE) and High Speed Packet Access (HSPA) communication technology, and the 4G communication technology may be a Long-Term Evolution (LTE) communication technology.

As the wireless communication technologies have evolved from the 2G communication technology into the 4G communication technology through the 3G communication technology, their communication conditions, such as modulation resolutions used during A/D modulation, and BandWidths (BW), have been changed as well.

Therefore, complex wireless communication environments have become commonplace, in which different wireless communication technologies or different wireless communication protocols, such as 2G and 3G communication technologies or 3G and 4G communication technologies, coexist. Because of this, terminals supporting wireless communications are developed to have a structure capable of supporting a plurality of different wireless communication technologies.

The 4G wireless communication technology uses the increasing A/D modulation resolution and bandwidth, along its evolution. Therefore, the evolved wireless communication technologies use a structure with a third order or more, capable of implementing high resolution during A/D modulation. However, a structure of an A/D modulation apparatus having a modulation order of a third order or more may have significantly low stability.

For example, in the case of a root-locus for a noise transfer function in each order, in modulation orders of first and second orders, signals converge in an inner area of a unit circuit, which is a stable area. However, in third and fourth orders, which are modulation orders higher than the first and second orders, signals may oscillate without converging in an outer area of the unit circuit, which is an unstable area.

Therefore, although a structure of an A/D modulation apparatus having a second order or less is always stable in system efficiency, a structure of an A/D modulation apparatus having modulation orders of third and fourth orders may be unstable due to amplitudes, frequencies and offsets of signals. These factors may cause a significant decrease in the system efficiency and yield because they vary depending even on temperature and process conditions. To address these problems, A/D modulation apparatuses may have a limiter that prevents oscillations, which, however, makes their design very difficult, and may not fully guarantee stability thereof.

For these reasons, there is a need for an A/D modulation apparatus that may ensure the future stability and a decrease in power consumption, and may meet the A/D modulation resolution required for each communication mode and/or wireless communication protocol to be used.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an apparatus and method for performing Analog/Digital (A/D) modulation to obtain an optimal modulation resolution for each communication mode corresponding to a communication standard.

Another aspect of the present disclosure is to provide an A/D modulation apparatus and method for improving efficiency of power consumption by matching a hardware structure to each protocol while modulating analog signals into digital signals in a receiving device of a mobile communication system supporting multiple protocols.

Another aspect of the present disclosure is to provide an A/D modulation apparatus and method for obtaining the modulation resolution needed in a communication mode to be used, by controlling at least one of a modulation order and an oversampling ratio.

Another aspect of the present disclosure is to provide an apparatus and method for performing A/D modulation by serially connecting unit loops having a second order or less, which have stability, and enabling or disabling the serially connected unit loops depending on a communication mode to be used.

Another aspect of the present disclosure is to provide an apparatus and method for adjusting a structure and a modulation order of an A/D modulation apparatus according to characteristics of each communication protocol in a communication mode where a frequency range is narrow but a resolution should be high and also in a communication mode where a frequency range is very broad.

In accordance with an aspect of the present disclosure, an A/D modulation apparatus with a Nyquist structure is provided. The modulation apparatus includes an A/D modulation module having a structure in which a plurality of unit loops are extended by a serial connection, the A/D modulation module being configured to receive an initial analog signal and output individual digital-modulated signals for the plurality of unit loops, a control module configured to determine a modulation resolution that is needed in order to use a communication mode, and configured to output modulation control bits to obtain the determined modulation resolution, a signal transfer control module including an input control module configured to transfer or block an intermediate output signal of a basic loop, to which the initial analog signal is input, from among the plurality of unit loops, as an input signal of an extended loop serially connected to the basic loop, in response to the modulation control bits provided from the control module, and an output module configured to generate a final digital-modulated signal based on a final output signal of the basic loop and a final output signal of the extended loop.

In accordance with another aspect of the present disclosure, a method for modulating an analog signal into a digital signal in an A/D modulation apparatus with a Nyquist structure is provided. The method includes performing a modulation control bit output process of determining a modulation resolution that is needed in order to use a communication mode, and outputting modulation control bits to obtain the determined modulation resolution, performing a basic input path control process of transferring or blocking an intermediate output signal of a basic loop, to which an initial analog signal is input, from among a plurality of unit loops having a structure in which the plurality of unit loops are extended by a serial connection, as an input signal of an extended loop serially connected to the basic loop, in response to the modulation control bits, and performing a final digital-modulated signal generation process of generating a final digital-modulated signal based on a final output signal of the basic loop and a final output signal of the extended loop.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
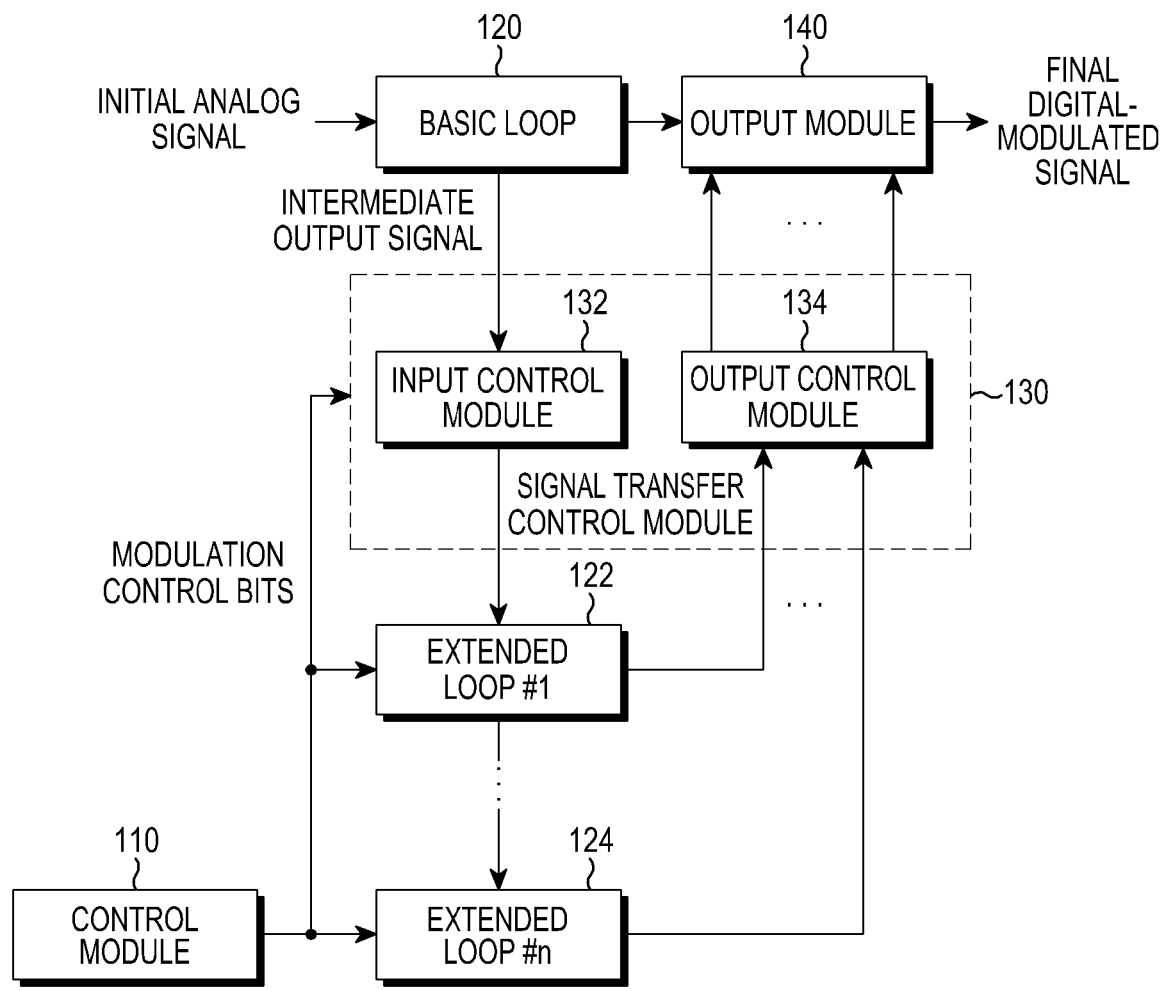
FIG. 1 shows a structure of an Analog/Digital (A/D) modulation apparatus according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Generally, an Analog/Digital (A/D) modulation apparatus adjusts A/D modulation characteristics only with a sampling clock frequency depending on each frequency range because it has a single structure, causing a lot of power consumption.

To address these shortcomings, as a method of supporting a modulation order of a third order or more during A/D modulation, a Multi-Stage Noise Shaping (MASH) structure is used, and the MASH structure serially connects A/D modulators with a second order or less, making it possible to always stably implement a high-order structure. In other words, when a MASH structure is used, an A/D modulation apparatus capable of supporting a high resolution and a broad bandwidth may be designed as a high-order structure. However, when it is applied to $2^{nd}$-Generation (2G) or $3^{rd}$-Generation (3G) communication technology, unnecessary devices may be continuously driven, even though the broad bandwidth is not needed, thus increasing the power consumption more than twice.

Therefore, a below-described embodiment of the present disclosure provides a method for configuring an A/D modulation apparatus using a MASH structure and controlling a modulation order for A/D modulation and an oversampling ratio according to a communication mode to be used.

In wireless communication systems, a modulation resolution that can be obtained by the oversampling A/D modulation may be defined as Equation (1) below. For example, the oversampling A/D modulation may be a delta-sigma modulator loop.

$$SQNR_{max} \approx 6.02N + 1.76 + (20L + 10)\log_{10} OSR - 10\log_{10} \frac{\pi^{2L}}{2L+1},\text{''}$$

Equation (1)

wherein Signal to Quantization Noise Ratio (SQNR) denotes a signal-to-quantization noise ratio indicating a modulation resolution, N denotes the number of bits for a quantizer, L denotes an order of an A/D modulator, and Over Sampling Ratio (OSR) denotes an oversampling ratio.

It can be noted from Equation (1) that a modulation resolution SQNR in an A/D modulator is proportional to an order L of an A/D modulator and an oversampling ratio OSR. In other words, a high modulation resolution SQNR may be obtained by increasing the order L of an A/D modulator, and/or by increasing the oversampling ratio OSR.

Figure 4:
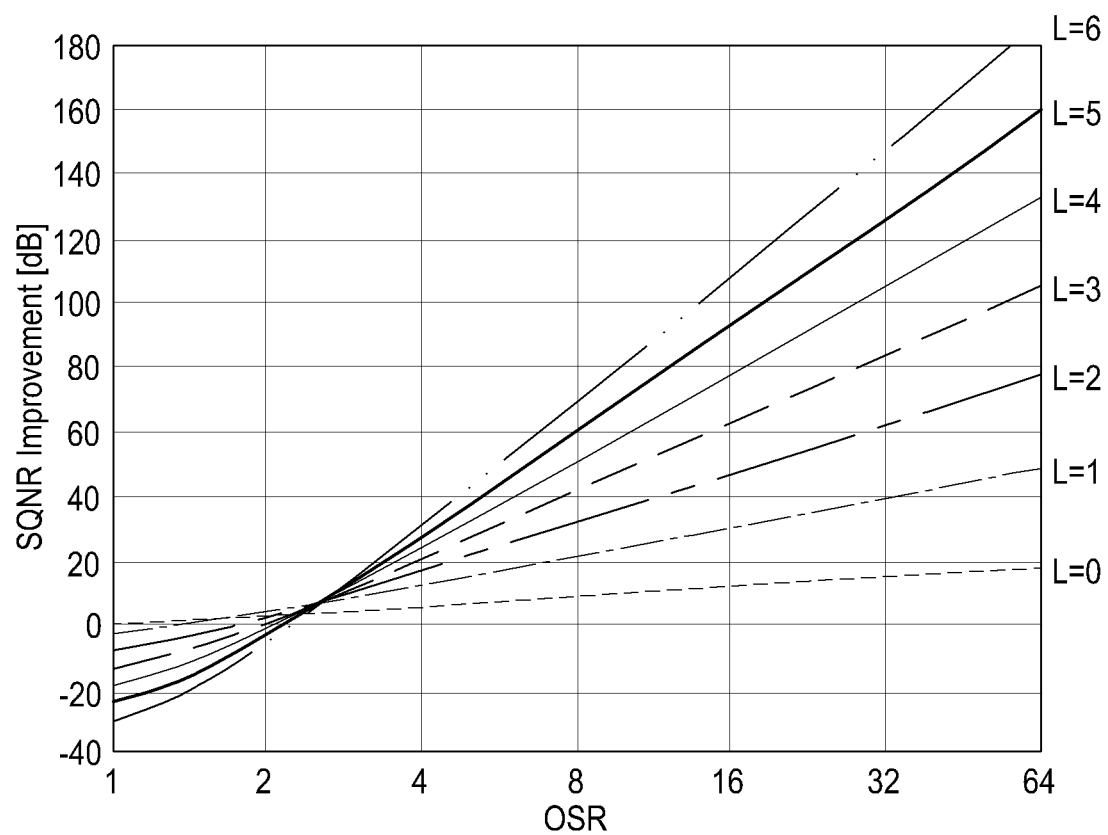
FIG. 4 shows an example of a relationship among a modulation resolution, a modulation order, and an oversampling ratio during A/D modulation according to an embodiment of the present disclosure.

FIG. 4 shows an example of a relationship among a modulation resolution, a modulation order, and an oversampling ratio during A/D modulation according to an embodiment of the present disclosure.

Referring to FIG. 4, a change in modulation resolution SQNR that can be obtained depending on a change in the order L of an A/D modulator and the oversampling ratio OSR is shown, wherein the higher the modulation order L of an A/D modulator, the higher modulation resolution SQNR may be obtained at the same oversampling ratio OSR. In addition, it may be noted that as the oversampling ratio OSR increases at the same modulation order L of an A/D modulator, the modulation resolution SQNR also increases.

Therefore, a high modulation order L and a high oversampling ratio OSR are needed to obtain a high modulation resolution SQNR. In other words, a desired modulation resolution SQNR may be obtained by A/D modulation by adjusting the modulation order L and the oversampling ratio OSR.

For example, in a receiver of a mobile communication system, a high Signal-to-Noise and Distortion Ratio (SNDR) is needed to modulate Intermediate Frequency (IF) signals and/or BaseBand (BB) signals into digital signals. In order to obtain an SNDR that meets these requirements, a method that is capable of properly adjusting the modulation order L of an A/D modulator and the oversampling ratio OSR, as needed, should be prepared.

Therefore, a below-described embodiment of the present disclosure provides a detailed method for performing A/D modulation to obtain an optimal modulation resolution for each communication mode. In particular, an embodiment of the present disclosure proposes an apparatus and method for adjusting the order L of an A/D modulator and the oversampling ratio OSR so that when a communication mode to be used is determined, an optimal modulation resolution corresponding to the determined communication mode may be obtained.

For example, an A/D modulation apparatus with a structure in which a plurality of first and/or second-order delta-sigma modulator loops are serially connected will be assumed. Each of the serially connected loops may be turned on/off depending on a communication protocol. Quantized results of lower loops and/or extended loops, from among the loops, pass through a differentiator in a digital domain and are then added up into quantized results of an upper loop or a basic loop, thus implementing high-order output.

In summary, when a low-power operation is desired, digital modulation is completed only with quantized results of one top loop, which may also be referred to as a basic loop. However, when a higher-power operation, e.g., high-resolution or broadband signal processing, is desired, not only the top loop, but also the lower loops, which may be referred to as extended loops, are sequentially included in an operation for A/D modulation.

An embodiment of the present disclosure will be described in detail below with reference to the accompanying drawings.

FIG. 1 shows a structure of an A/D modulation apparatus according to an embodiment of the present disclosure.

Referring to FIG. 1, an A/D modulation apparatus 100 has a structure in which a plurality of unit loops are extended by a serial connection. The A/D modulation apparatus 100 with this structure receives an initial analog signal and outputs individual digital-modulated signals for the plurality of unit loops.

In the A/D modulation apparatus 100, the plurality of unit loops extended by a serial connection include one basic loop and 'n' extended loops, where 'n' is a positive integer greater than or equal to 1. Therefore, it will be apparent to those skilled in the art that the A/D modulation apparatus 100 may include one basic loop and at least one extended loop.

In the A/D modulation apparatus 100, the serial connection of unit loops may refer to a connection structure in which an output signal of a basic loop is applied as an input signal of a first extended loop, and an output signal of the first extended loop is applied as an input signal of the next extended loop.

A basic loop 120 receives an initial analog signal. The term 'initial analog signal', as used herein, may refer to an analog signal that is input to the A/D modulation apparatus 100 for A/D modulation.

The basic loop 120 has a predetermined order for A/D modulation, i.e., a modulation order, and modulates the initial analog signal into a digital signal based on the modulation order and outputs the modulated digital signal. For example, the basic loop 120 may be implemented with a delta-sigma modulator having a structure in which as many integrators as the modulation order are connected as one loop. In the basic loop 120, digital modulation is performed by a quantizer connected to the last integrator, from among the integrators corresponding to the modulation order which constitute one loop.

The basic loop 120 outputs a final output signal obtained by digital modulation to an output module 140. The final output signal is a digital-modulated signal that the basic loop 120 has obtained by performing digital modulation on the initial analog signal.

The basic loop 120 provides an intermediate output signal to a signal transfer control module 130. The intermediate output signal may be a signal output from one of the remaining integrators, except for the last integrator, which constitute one loop in the basic loop 120. For example, when a second-order delta-sigma modulator is used as the basic loop 120, an analog signal output from the first integrator, from among two integrators forming one loop, in the basic loop 120 may be an intermediate output signal.

The intermediate output signal output from the basic loop 120 is input to an input control module 132 that is included the signal transfer control module 130. The signal transfer control module 130 further includes an output control module 134 in addition to the input control module 132.

The signal transfer control module 130 operates based on modulation control bits from a control module 110. For example, the signal transfer control module 130 transfers or blocks the intermediate output signal from the basic loop 120 as an input of an extended loop #1 122 based on the modulation control bits from the control module 110. The signal transfer control module 130 may transfer or block final output signals, from extended loops #1~#n 122 to 124, corresponding to a predetermined modulation order, to the output module 140 based on the modulation control bits from the control module 110. The signal transfer control module 130 may transfer final output signals only from some of the plurality of extended loops 122 and 124 to the output module 140, and may block final output signals from the remaining extended loops. To transfer or block the final output signal from at least one extended loop to the output module 140 as described above, the signal transfer control module 130 includes the output control module 134.

For example, it is assumed in FIG. 1 that one output control module, that is the output control module 134, controls to transfer or block final output signals output from the plurality of the extended loops #1~#n 122 to 124. However, the present disclosure is not limited thereto, and it will be apparent to those skilled in the art that the signal transfer control module 130 may be implemented in a structure in which individual output control modules (not shown) are provided for final output signals output from the extended loops #1~#n 122 to 124, and the individual output control modules are separately controlled based on the modulation control bits provided from the control module 110. Modulation control bits from the control module 110 may be provided separately for the individual output control modules, or may be provided in common for all of the individual output control modules.

It is preferable that, when the individual output control modules are provided for the extended loops #1~#n 122 to 124 on a one-to-one basis, the input control modules may also be independently provided between extended loops. In other words, the input control modules may be controlled such that for the extended loop whose final output signal is blocked, an intermediate output signal from its preceding extended loop is blocked from being input.

Therefore, a modulation order for A/D modulation may be adjusted by controlling input to and output from the extended loops constituting the A/D modulation module based on modulation control bits from the control module 110. For example, when a modulation order of the basic loop 120 and the extended loops 122 and 124 is assumed to be a second order, the A/D modulation apparatus 100 operates as an A/D modulation apparatus that uses a $2^n$-th order as a modulation order, based on modulation control bits from the control module 110. In other words, if the intermediate output signal output from the basic loop 120 is blocked by the signal transfer control module 130 in response to the modulation control bits from the control module 110, then the A/D modulation apparatus 100 performs A/D modulation based on a modulation order of a second order. However, if the intermediate output signal output from the basic loop 120 is transferred to the extended loop #1 122 by the signal transfer control module 130 in response to the modulation control bits from the control module 110, then the A/D modulation apparatus 100 performs A/D modulation based on a modulation order of a fourth order. In other words, the A/D modulation apparatus 100 operates as an A/D modulation apparatus that uses a modulation order of a fourth order, by the basic loop 120 having a modulation order of a second order and the extended loop #1 122 having a modulation order of a second order. If one extended loop is added for A/D modulation, then the A/D modulation apparatus 100 will perform A/D modulation based on a modulation order of a sixth order.

As is apparent from the foregoing description, the control module 110 may control a modulation order for determining an A/D modulation resolution by controlling input and output of each extended loop. If the basic loop 120 and the extended loops 122 and 124 have a modulation order of a second order, then a modulation order for determining a modulation resolution will be determined as a $2^n$-th order under control of the control module 110. As another example, if the basic loop 120 and the extended loops 122 and 124 have a modulation order of a fourth order, then a modulation order for determining a modulation resolution will be determined as a $4^n$-th order under control of the control module 110.

The control module 110 may adjust a modulation order or an oversampling ratio OSR to obtain a desired modulation resolution by controlling at least one of a plurality of integrators constituting each extended loop based on modulation control bits. For example, if the extended loop #1 122 is assumed to have a modulation order of a second order, then it may disable at least one of two integrators existing in the extended loop #1 122 in response to the modulation control bits. In this case, as the extended loop #1 122 has a modulation order of a first order, the A/D modulation apparatus 100 performs A/D modulation based on a modulation order of a third order when considering the basic loop 120 together with the extended loop #1 122.

In addition, the control module 110 may control the oversampling ratio OSR to be used for A/D modulation separately for each unit loop based on the modulation control bits. The oversampling ratio OSR, as stated above, may be a factor for determining a modulation resolution together with the modulation order. The oversampling ratio OSR may be controlled only for the basic loop and extended loops enabled for A/D modulation.

As described above, the control module 110 determines a modulation resolution needed for a communication mode to be used, and generates modulation control bits for obtaining the determined modulation resolution. The control module 110 may generate modulation control bits by taking into account the modulation order and oversampling ratio OSR needed to obtain the determined modulation resolution.

For example, Table 1 below defines Signal-to-Noise and Distortion Ratios (SNDRs) needed individually for communication modes corresponding to the major mobile communication standards, and defines Modulate Control Bits (MCBs) corresponding to conditions for obtaining the SNDRs.

TABLE 1

| MODE | BW (MHz) | CLK (ms) | SNR (dB) | OSR | order | SNDR | Power | MCS |
|---|---|---|---|---|---|---|---|---|
| | | | | Normal mode | | | | |
| GSM | 0.1 | 26 | 71 | 64 | 2 | 81 | 5 | 0000 |
| EDGE | 0.11 | 26 | 71 | 64 | 2 | 81 | 5 | 0001 |
| HSPA | 1.92 | 107.52 | 62 | 16 | 2 | 66 | 20 | 0010 |
| LTE1 | 0.7 | 30.72 | 62 | 16 | 2 | 66 | 5 | 0011 |
| LTE2 | 1.5 | 61.44 | 62 | 16 | 2 | 66 | 10 | 0100 |
| LTE3 | 2.5 | 107.52 | 62 | 16 | 2 | 66 | 20 | 0101 |
| LTE4 | 5.0 | 215.04 | 62 | 16 | 2 | 66 | 25 | 0110 |
| LTE5 | 7.5 | 430.08 | 62 | 16 | 2 | 66 | 30 | 0111 |
| LTE6 | 10 | 430.08 | 62 | 16 | 2 | 66 | 40 | 1000 |
| LTE7 | 10 | 430.08 | 71 | 16 | 4 | 82 | 160 | 1001 |
| LTE8 | 20 | 430.08 | 62 | 8 | 4 | 67 | 160 | 1010 |

In accordance with Table 1, in a case where GSM, corresponding to the 2G mobile communication standard, is used, as a modulation resolution of 70 dB or more is needed, GSM may be implemented with an A/D modulation structure having an oversampling ratio OSR of 64 and a modulation order of a second order. However, LTE, corresponding to the 4G mobile communication standard, needs a modulation resolution of 62 dB or more. Therefore, LTE may hardly have an oversampling ratio OSR of 16 or more as it needs a broad bandwidth, so LTE may be implemented with an A/D modulation structure having a modulation order of a third or fourth order.

In Table 1, BW represents a bandwidth of input signals, Clock (CLK) represents a sampling frequency to be used for quantization during A/D modulation, and Signal-to-Noise Ratio (SNR) represents a level of a modulation resolution needed in a related communication mode. It can be noted from Table 1 that a modulation resolution, e.g., SNDR, that can be obtained when the oversampling ratio OSR and the modulation order defined for each communication mode, which are applied, meet the level of the needed modulation resolution.

As can be understood from Table 1, by changing a modulation order according to the communication mode to be used, it is possible to prevent an increase in power consumption due to the use of an unnecessarily high modulation order. In other words, it can be noted from Table 1 that LTE7 and LTE8, using a modulation order of a fourth order, sharply increase in power consumption compared to other communication modes.

In addition, Table 1 defines an example of modulation control bits that the control module 110 will generate for each communication mode. The modulation control bits defined in Table 1, for example, are defined with 4 bits to identify 11 types of communication modules. However, the present disclosure is not limited thereto, and it will be apparent to those skilled in the art that the number of bits defining modulation control bits is subject to change depending on the increase and/or decrease in a number of supportable communication modes.

As another example, modulation control bits may be assigned separately for each combination of the oversampling ratio OSR and modulation order to be used, without being defined separately for each communication mode. In this case, even different communication modes may define the same modulation control bits for the same combination of the oversampling ratio OSR and the modulation order. The number of bits constituting modulation control bits may be determined by taking into account the number of combinations of the oversampling ratios OSR and the modulation orders.

For example, in Table 1, modulation control bits of "00" may be defined for GSM and EDGE, which are communication modes that use an oversampling ratio OSR of 64 and a modulation order of a second order, and modulation control bits of "01" may be defined for HSPA and LTE1~LTE6, which are communication modes that use an oversampling ratio OSR of 16 and a modulation order of a second order. Modulation control bits of "10" may be defined for LTE7, which is a communication mode that uses an oversampling ratio OSR of 16 and a modulation order of a fourth order, and modulation control bits of "11" may be defined for LTE8, which is a communication mode that uses an oversampling ratio OSR of 8 and a modulation order of a fourth order.

The output module 140 outputs a final digital-modulated signal, using an output signal from the basic loop 120 and output signals from at least one extended loop, which are received through the output control module 134 in the signal transfer control module 130. However, when the output control module 134 is blocked by the modulation control bits from the control module 110, the output module 140 outputs the output signal from the basic loop 120 as a final digital-modulated signal.

Figure 2:
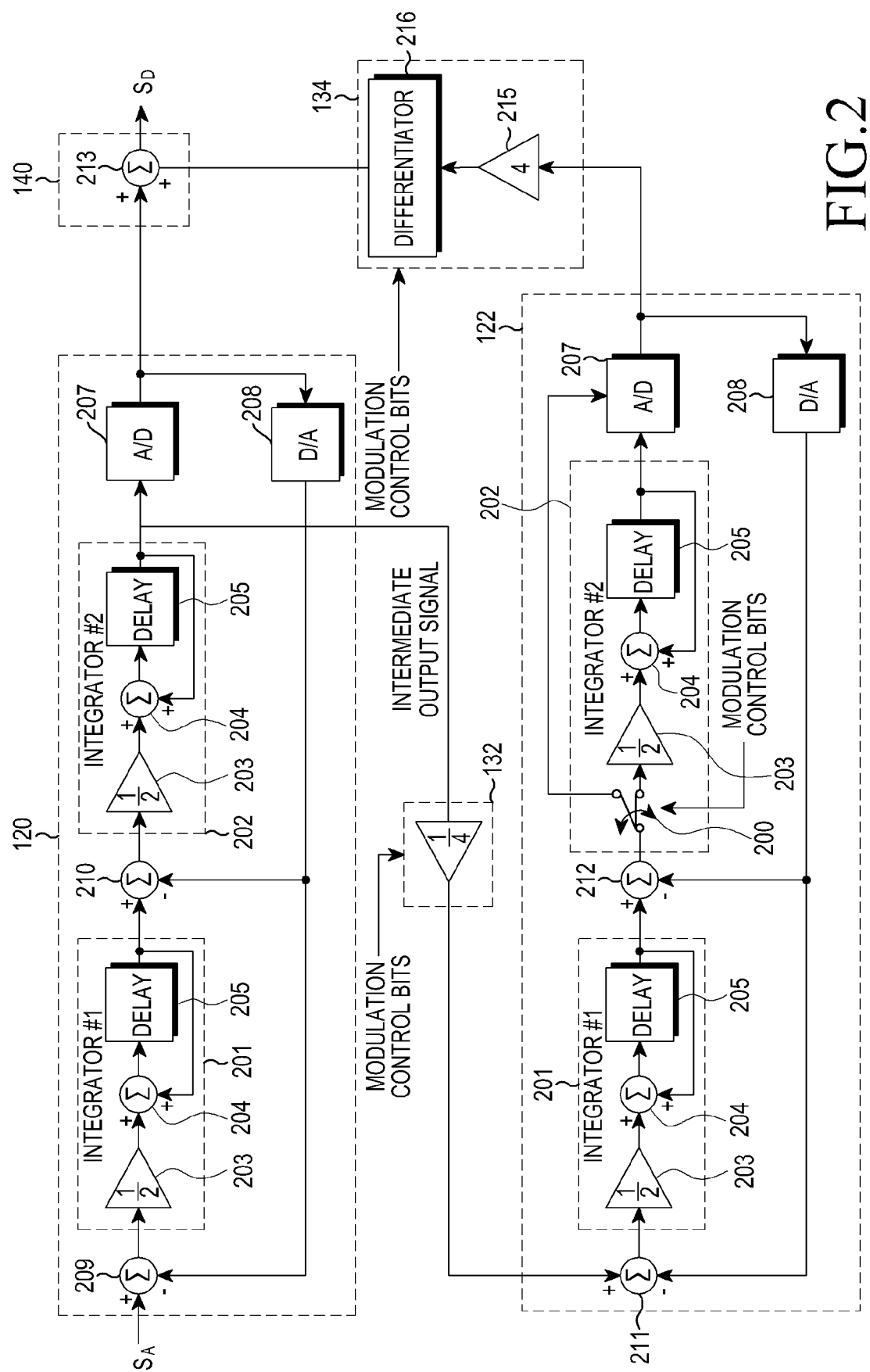
FIG. 2 shows an example of an A/D modulation apparatus implemented with a second-order delta-sigma modulator according to an embodiment of the present disclosure.

FIG. 2 shows an example of an A/D modulation apparatus implemented with a second-order delta-sigma modulator according to an embodiment of the present disclosure.

Referring to FIG. 2, the control module 110 is not considered in the A/D modulation apparatus 100 described in connection with FIG. 1. Instead, only modulation control bits provided from the control module 110 are shown in FIG. 2.

However, when the A/D modulation apparatus 100 is configured as shown in FIG. 2, it is not that the control module 110 shown in FIG. 1 is unnecessary, but rather, the control module 110 does not need to be shown in order to describe FIG. 2. Therefore, it will be assumed that in the following description of FIG. 2, the operations of the control module 110 described with reference to FIG. 1 are performed in the same way even in the A/D modulation apparatus 100 having the structure of FIG. 2. For better understanding of an embodiment of the present disclosure, the same reference numerals will be used in FIG. 2 to refer to the same elements as those shown in FIG. 1.

The A/D modulation apparatus 100 having a basic loop 120 and one extended loop, such as extended loop #1 122, serially connected to the basic loop 120 will be considered in FIG. 2 for convenience of description. However, it will be apparent to those skilled in the art that extended loops may be serially connected additionally as described with reference to FIG. 1.

Referring to FIG. 2, the basic loop 120 and the extended loop #1 122 have a structure of a delta-sigma modulator having a modulation order of a second order. In other words, the fact that the basic loop 120 and the extended loop #1 122 have a modulation order of a second order may be determined from the fact that they each have two integrators, INTEGRATOR#1 201 and INTEGRATOR#2 202.

Each of the two integrators INTEGRATOR#1 and INTEGRATOR#2, which are both respectively included in the basic loop 120 and the extended loop 122, has a signal attenuator 203, an adder 204 and a delay 205. The signal attenuator 203 attenuates an input strength of input signals to ½ of the input strength. The adder 204 adds a signal from the signal attenuator 203 and a signal from the delay 205 and outputs the added signal to the delay 205. The delay 205 delays the signal received from the adder 204 based on a set value.

However, for any one of two integrators INTEGRATOR#1 201 and INTEGRATOR#2 202 constituting the extended loop 122, its operation should be able to be controlled based on modulation control bits. For example, any one of two integrators INTEGRATOR#1 201 and INTEGRATOR#2 202 should be able to be enabled or disabled based on the modulation control bits.

FIG. 2 presents an example in which a switch 206 is additionally provided at an input end of the integrator INTEGRATOR#2 202 located in a rear stage among the two integrators INTEGRATOR#1 201 and INTEGRATOR#2 202 constituting the extended loop 122, and an operation of the switch 206 may be controlled based on modulation control bits.

For example, the operation of the integrator INTEGRATOR#2 202 may be disabled to allow the A/D modulation apparatus 100 to operate with a modulation order of a third order. To this end, the switch 206 may be controlled based on the modulation control bits to form a path such that an input signal to the integrator INTEGRATOR#2 202 may be output in a manner that is unchanged. However, the operation of the integrator INTEGRATOR#2 202 may be enabled to allow the A/D modulation apparatus 100 to operate with a modulation order of a fourth order. To this end, the switch 206 may be controlled based on the modulation control bits to form a path for providing an output signal of the integrator INTEGRATOR#1 201 to the integrator INTEGRATOR#2 202.

In the basic loop 120 and/or the extended loop 122, a signal output from the integrator INTEGRATOR#2 202 in the rear stage is input to an A/D modulator 207 in which the signal is modulated into a digital signal by digital modulation. The digital modulation is performed through sampling, binarization, and the like. A sampling frequency and the oversampling ratio OSR are used during a sampling operation for the digital modulation. Although not shown in FIG. 2, the oversampling ratio OSR used for A/D modulation may be adjusted based on modulation control bits provided from the control module 110 as described above. The digital signal generated through the A/D modulation will be used as a final output signal of the basic loop 120 and/or the extended loop 122.

The final output signal is provided as an input of a Digital to Analog (D/A) modulator 208 included in the basic loop 120 and/or the extended loop 122. The D/A modulator 208 included in the basic loop 120 and/or the extended loop 122 modulates an input digital signal back into an analog signal, and outputs the analog signal.

The basic loop 120 and the extended loop 122 have respective subtractors at an input end of each of their integrators.

For example, in the basic loop 120, a first subtractor 209, disposed between an input end and the first integrator INTEGRATOR#1 201 subtracts a feedback signal provided from the D/A modulator 208 from an initial analog signal received through the input end, and provides the subtracted signal as an input signal of the first integrator INTEGRATOR#1 201. In the basic loop 120, a second subtractor 210, disposed between the first integrator INTEGRATOR#1 201 and a second integrator INTEGRATOR#2 202, subtracts a feedback signal provided from the D/A modulator 208 from an analog signal output from the first integrator INTEGRATOR#1 201, and provides the subtracted signal as an input signal of the second integrator INTEGRATOR#2 202.

In the extended loop 122, a third subtractor 211, disposed between an input end and a first integrator INTEGRATOR#1 201, subtracts a feedback signal provided from the D/A modulator 208 from an intermediate output signal of the basic loop 120, which is received through the input end, and provides the subtracted signal as an input signal of the first integrator INTEGRATOR#1 201. In the extended loop 122, a fourth subtractor 212, disposed between the first integrator INTEGRATOR#1 201 and a second integrator INTEGRATOR#2 202, subtracts a feedback signal provided from the D/A modulator 208 from an analog signal output from the first integrator INTEGRATOR#1 201, and provides the subtracted signal as an input signal of the second integrator INTEGRATOR#2 202.

The intermediate output signal corresponds to an output signal of the second integrator INTEGRATOR#2 202 in the basic loop 120. The intermediate output signal is provided as an input signal of the third subtractor 211, which is disposed in the extended loop 122, through an input control module 132, which is controlled based on modulation control bits. For example, the input control module 132 may include a variable gain amplifier whose amplification rate is adjusted based on the modulation control bits. For example, the variable gain amplifier may be an attenuator supporting an attenuation ratio of 1/4. The attenuator may be enabled or disabled based on the modulation control bits.

Referring to Table 1, if modulation control bits corresponding to the use of a communication mode needing a modulation order of a second order are output by the control module 110 shown in FIG. 1, then the input control module 132, e.g., the attenuator, that is controlled based on the modulation control bits will be disabled so as to block the intermediate output signal. However, if modulation control bits corresponding to the use of a communication mode needing a modulation order of an order higher than the second order, e.g., a third order or a fourth order, are output by the control module 110, then the input control module 132, e.g., the attenuator, that is controlled based on the modulation control bits will be enabled so as to attenuate the intermediate output signal at a set attenuation ratio and output the attenuated signal.

As described in the above operation, the modulation order of the A/D modulation apparatus 100 may be determined by controlling an operation of the attenuator that transfers or blocks the intermediate output signals based on the modulation control bits from the control module 110. As another example, an output control module 134, for blocking or transferring an output signal of the extended loop 122, may be provided as a structure for determining a modulation order of the A/D modulation apparatus 100.

For instance, the output signal of the extended loop 122 is provided as an input signal of an adder 213, included in the output module 140, through the output control module 134 that is controlled based on modulation control bits. For example, the output control module 134 may include an amplifier 215 having an amplification rate of 4, and a differentiator 216. The amplifier 215 and/or the differentiator 216 may be enabled or disabled based on the modulation control bits.

For example, the amplifier 215 may be a variable gain amplifier whose amplification rate is adjusted based on the modulation control bits, and the differentiator 216 may be a differentiator that performs high-pass filtering on an output signal of the variable gain amplifier based on a predetermined transfer function.

Referring to Table 1, if modulation control bits corresponding to the use of a communication mode needing a modulation order of a second order are output by the control module 110 shown in FIG. 1, then the output control module 134, e.g., the amplifier 215 and/or the differentiator 216, that is controlled based on the modulation control bits will be disabled so as to block the output signal of the extended loop 122. However, if modulation control bits corresponding to the use of a communication mode needing a modulation order of an order higher than the second order, e.g., a third order or a fourth order, are output by the control module 110, then the output control module 134, e.g., the amplifier 215 and/or the differentiator 216, that is controlled based on the modulation control bits will be enabled so as to amplify the output signal of the extended loop 122 at a set amplification rate, accumulate the amplified signal for a predetermined period, and then output the accumulated signal as an input to the output module 140.

As described in the above operations, the modulation order of the A/D modulation apparatus 100 may be determined by controlling transferring or blocking of the output signal of the extended loop 122 based on the modulation control bits from the control module 110.

It will be understood by those of ordinary skill in the art that the A/D modulation apparatus 100 is configured to include both the input control module 132 and the output control module 134 and is configured to control operations of both the input control module 132 and the output control module 134 based on the modulation control bits provided by the control module 110.

In addition, the modulation order of the A/D modulation apparatus 100 may be controlled by enabling or disabling an integrator included in the extended loop 122. For example, the modulation order of the A/D modulation apparatus 100 may be controlled by controlling operations of the two integrators INTEGRATOR#1 201 and INTEGRATOR#2 202 included in the extended loop 122, based on the modulation control bits provided from the control module 110. For example, the switch 206 that is controlled based on the modulation control bits is provided at an input end of the second integrator INTEGRATOR#2 202, from among the two integrators INTEGRATOR#1 201 and INTEGRATOR#2 202 included in the extended loop 122. An output signal of the fourth subtractor 212 is applied to an input end of the switch 206. One of two output ends of the switch 206 is connected to an input end of the second integrator INTEGRATOR#2 202, and the other output end is connected at an output end of the second integrator INTEGRATOR#2 202.

Therefore, if the output end of the switch 206 is connected to the input end of the second integrator INTEGRATOR#2 202 based on the modulation control bits, them a modulation order of the extended loop 122 is a second order, and the overall modulation order of the A/D modulation apparatus 100 is a fourth order. However, if the output end of the switch 206 is connected to the output end of the second integrator INTEGRATOR#2 202 based on the modulation control bits, then a modulation order of the extended loop 122 is a first order, and the overall modulation order of the A/D modulation apparatus 100 is a third order.

As described above, the modulation order of the extended loop 122 may be determined as a first order or a second order by controlling the switch 206. So, more description thereof will be omitted. However, the structure of changing a modulation order of the extended loop 122 by controlling an operation of the switch 206 may be provided in all integrators constituting the extended loop 122. In this case, the input control module 132 and/or the output control module 134 for controlling the overall operation of the extended loop 122 may not be provided.

Table 2 below shows an example of operations of the input control module 132, the output control module 134 and an internal control module, e.g., the switch 206, based on the MCBs shown in Table 1.

TABLE 2

| MCB | Input control module | Output control module | Internal control module | Order |
|---|---|---|---|---|
| 0000 | Disable | Disable | Done | 2 |
| 0010 | Disable | Disable | Done | 2 |
| 0011 | Disable | Disable | Done | 2 |
| 0100 | Disable | Disable | Done | 2 |
| 0101 | Disable | Disable | Done | 2 |
| 0110 | Disable | Disable | Done | 2 |
| 0111 | Disable | Disable | Done | 2 |
| 1000 | Disable | Disable | Done | 2 |
| 1001 | Enable | Enable | Enable | 4 |
| 1010 | Enable | Enable | Enable | 4 |

In Table 2, there is no case with a modulation order of a third order. However, as described above, A/D modulation based on a modulation order of a third order may be performed by blocking signal processing by the second integrator INTEGRATOR#2 202 in the extended loop 122.

The output module 140 outputs a digital signal output from the basic loop 120 as a final digital signal $S_D$. The outputted final digital signal $S_D$ may be a digital signal that has undergone A/D modulation based on a modulation order of a second order and a predetermined oversampling ratio OSR. Otherwise, the final digital signal $S_D$ may be output by adding a digital signal output from the basic loop 120 and a digital signal output from the extended loop 122. Additionally, the outputted final digital signal $S_D$ may a digital signal that has undergone A/D modulation based on a modulation order of a fourth order and a predetermined oversampling ratio OSR.

In the foregoing description, only controlling a modulation order to obtain a desired modulation resolution during A/D modulation has been described. However, although not illustrated in FIG. 2, the oversampling ratio OSR to be used in the basic loop 120 and the extended loop 122 may be controlled based on modulation control bits output from the control module 110. However, it is easy to adjust the oversampling ratio OSR to be used in the A/D modulator 207 and the D/A modulator 208 included in the basic loop 120, and the A/D modulator 207 and the D/A modulator 208 included in the extended loop 122, based on an external control signal.

Figure 3:
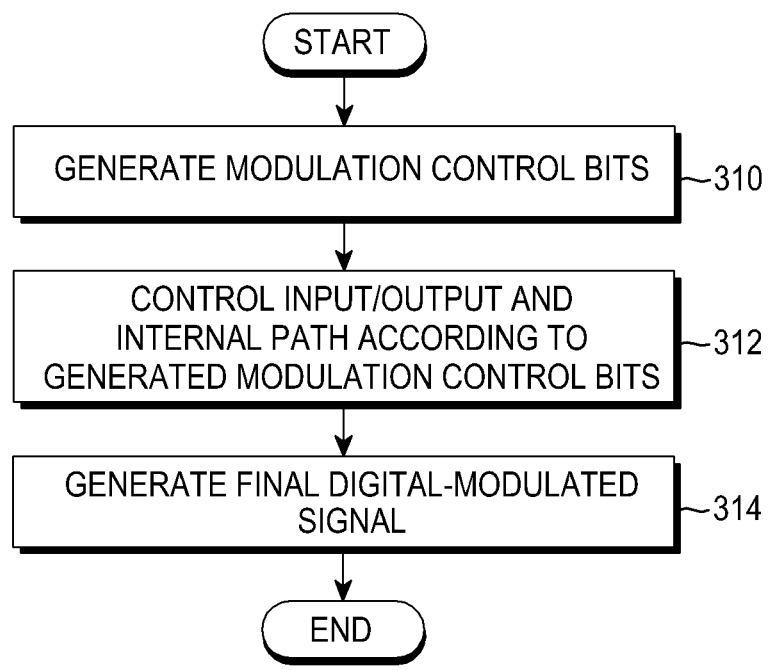
FIG. 3 shows a control flow for performing A/D modulation according to an embodiment of the present disclosure.

FIG. 3 shows a control flow for performing A/D modulation according to an embodiment of the present disclosure.

Referring to FIG. 3, the A/D modulation apparatus generates modulation control bits, for obtaining a modulation resolution needed for a communication mode to be used, in operation 310. The communication mode to be used is a communication mode that the A/D modulation apparatus has selected from among a plurality of supportable communication modes. Each of the plurality of communication modes has a modulation resolution it needs to obtain through A/D modulation. For example, Table 1 shows modulation resolutions needed in respective communication modes, in units of SNRs. In other words, GSM, EDGE and LTE7 need an SNR of 71 dB or more, and HSPA, LTE1~LTE6 and LTE8 need an SNR of 62 dB or more.

The A/D modulation apparatus has an MCB generation table in which MCBs for obtaining the needed modulation resolutions are individually, for a plurality of supportable communication modes, set in advance. The A/D modulation apparatus determines a communication mode to be used, and generates modulation control bits, which are set in the MCB generation table in previous, in association with the determined communication mode.

In operation 312, the A/D modulation apparatus controls an input/output and internal path according to the generated modulation control bits. In other words, the A/D modulation apparatus sets a modulation order needed for A/D modulation and an oversampling ratio OSR depending on the generated modulation control bits. In other words, the A/D modulation apparatus sets a modulation order and an oversampling ratio OSR for obtaining a modulation resolution higher than the needed resolution through A/D modulation corresponding to the communication mode to be used.

Therefore, the A/D modulation apparatus sets up a processing path of signals for performing A/D modulation based on the needed modulation order and oversampling ratio OSR by controlling an input/output and internal path. Controlling an input path refers to controlling a path for transferring an intermediate output signal of a basic loop to an extended loop, or transferring an intermediate output signal of the extended loop to the basic loop. Controlling an output path refers to controlling a path for transferring signals output from at least one extended loop to a final output module. Controlling an internal path refers to controlling operations of at least one integrator included in at least one extended loop and adjusting a modulation order.

The A/D modulation apparatus may be adjusted by controlling a path for adjusting a modulation order for A/D modulation, and also may be adjusted by controlling an oversampling ratio OSR to be used during A/D modulation based on previously generated modulation control bits in the basic loop or at least one extended loop.

If the setting for obtaining a needed modulation resolution by performing A/D modulation in the above-described operation is completed, then the A/D modulation apparatus generates, and/or outputs, a final digital-modulated signal by performing A/D modulation on an analog signal that is initially input for A/D modulation, in operation 314. An A/D modulation operation for obtaining a needed modulation resolution based on, for example, an oversampling ratio OSR and a modulation order, may be easily implemented by those skilled in the art. So, a detailed description thereof will be omitted.

Figure 5:
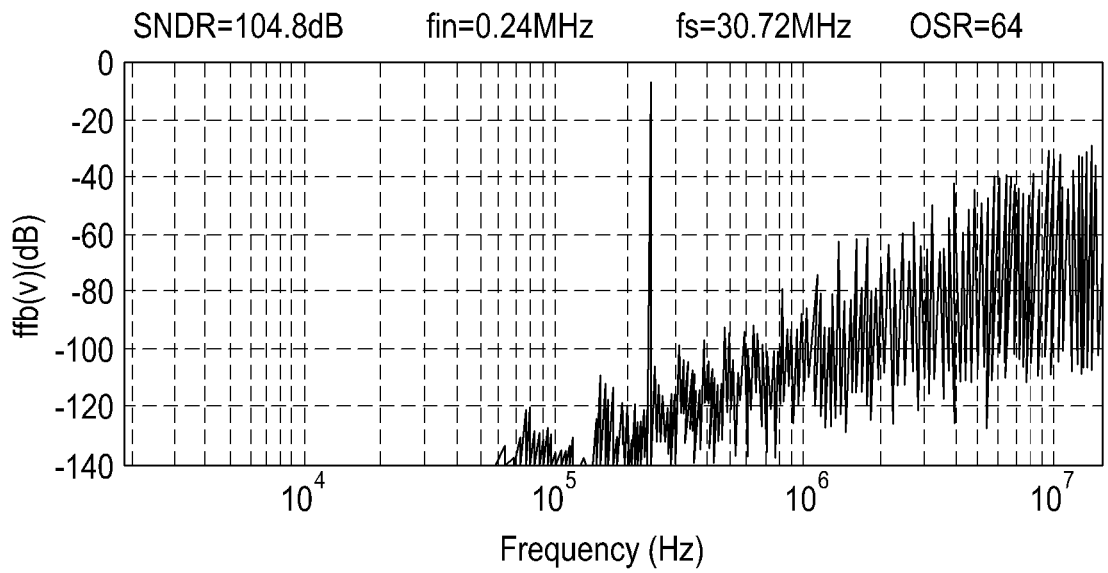
FIG. 5 shows a resulting graph of a modulation resolution obtained during operation in a communication mode corresponding to a $2^{nd}$-Generation (2G) communication standard according to an embodiment of the present disclosure.

FIG. 5 shows a resulting graph of a modulation resolution obtained during operation in a communication mode corresponding to the 2G communication standard according to an embodiment of the present disclosure.

Referring to FIG. 5, there is shown, in other words, experimental results when an A/D modulation apparatus proposed by an embodiment of the present disclosure performs A/D modulation for GSM corresponding to an example of the 2G communication standard according to an embodiment of the present disclosure.

Conditions for obtaining the resulting graph in FIG. 5 are to implement the A/D modulation apparatus by serially connecting two unit loops having a second order. The A/D modulation apparatus is implemented to have a second-order structure by enabling only the upper loop, i.e. the basic loop, during low-power operation, and to have a fourth-order structure by enabling both the upper loop and the lower loops, i.e. the extended loops, during high-performance operation.

In a case where GSM, which is a typical 2G standard, is considered, it is assumed that A/D modulation is performed based on the second-order structure, i.e., a modulation order of 2, and the oversampling ratio of 64, since the GSM signal band is a low band, such as a signal band of 240 kHz or less. As a result, it can be understood that a modulation resolution of 104.8 dB may be obtained. In this case, the sampling frequency is 30.72 MHz, and when a higher sampling frequency is applied, a higher resolution may be implemented.

Figure 6:
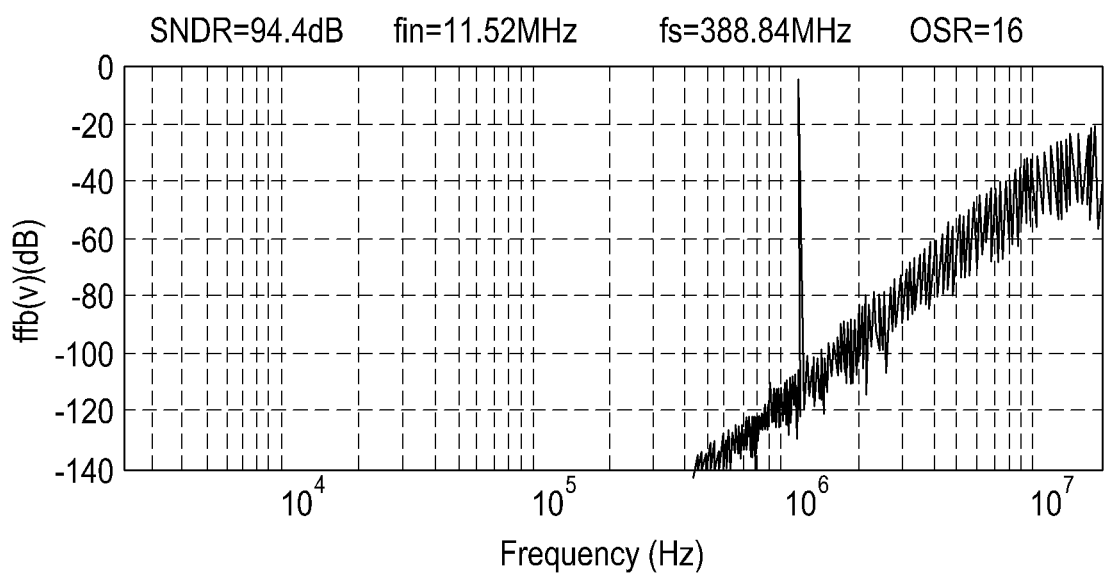
FIG. 6 shows a resulting graph of a modulation resolution obtained during operation in a communication mode corresponding to the $4^{th}$-Generation (4G) communication standard according to an embodiment of the present disclosure.

FIG. 6 shows a resulting graph of a modulation resolution obtained during operation in a communication mode corresponding to the 4G communication standard according to an embodiment of the present disclosure.

Referring to FIG. 6, there is shown, in other words, experimental results when an A/D modulation apparatus proposed by an embodiment of the present disclosure performs A/D modulation for LTE7 corresponding to an example of the 4G communication standard according to an embodiment of the present disclosure.

Conditions for obtaining the resulting graph in FIG. 6 are to implement the A/D modulation apparatus by serially connecting two unit loops having a second order like in FIG. 5. The A/D modulation apparatus is implemented to have a second-order structure by enabling only the upper loop during low-power operation, and to have a fourth-order structure by enabling both the upper loop and the lower loops during high-performance operation.

In a case where LTE7, which is a typical 4G standard, is considered, its signal band may hardly have an oversampling ratio exceeding 16 due to limitations of the sampling frequency for satisfying a broad bandwidth of 10 MHz. For these reasons, A/D modulation is performed based on the fourth-order structure, i.e., a modulation order of 4, that enables the second-order lower loops and sums up their results. Therefore, a high modulation resolution of, for example, 94.4 dB may be obtained even at a low oversampling ratio.

As is apparent from the foregoing description, according to an embodiment of the present disclosure, an A/D modulation apparatus, having a structure, such as a Nyquist structure, in which a plurality of unit loops corresponding to delta-sigma modulator loops are serially connected, enables and disables operations of the serially connected lower loops, thereby making it possible to obtain a modulation resolution that agrees with each communication standard, and making it possible to prevent the power from unnecessarily being consumed to obtain a modulation resolution that agrees with each communication standard.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An Analog/Digital (A/D) modulation apparatus with a Nyquist structure, the A/D modulation apparatus comprising:
   an A/D modulation module having a structure in which a plurality of unit loops are extended by a serial connection, the A/D modulation module being configured to receive an initial analog signal and output individual digital-modulated signals for the plurality of unit loops;
   a control module configured to determine a modulation resolution that is needed in order to use a communication mode, and configured to output modulation control bits to obtain the determined modulation resolution;
   a signal transfer control module including an input control module configured to transfer or block an intermediate output signal of a basic loop, to which the initial analog signal is input, from among the plurality of unit loops, as an input signal of an extended loop serially connected to the basic loop, in response to the modulation control bits provided from the control module; and
   an output module configured to generate a final digital-modulated signal based on a final output signal of the basic loop and a final output signal of the extended loop.

2. The A/D modulation apparatus of claim 1, wherein the signal transfer control module further includes an output control module configured to transfer or block the final output signal of the extended loop as an input signal of the output module in response to the modulation control bits.

3. The A/D modulation apparatus of claim 2, wherein the extended loop includes at least one integrator that is enabled or disabled in response to the modulation control bits.

4. The A/D modulation apparatus of claim 1, wherein each of the plurality of unit loops is a second-order delta-sigma modulator.

5. The A/D modulation apparatus of claim 4, wherein the intermediate output signal is an output signal of a last integrator among a plurality of integrators included in a second-order delta-sigma modulator corresponding to the basic loop.

6. The A/D modulation apparatus of claim 2, wherein the signal transfer control module further includes:
   an input control module configured to transfer or block an intermediate output signal of an extended loop as an input signal of another extended loop, which is serially connected, in response to the modulation control bits; and
   an output control module configured to transfer or block a final output signal of the other extended loop as an input signal of the output module in response to the modulation control bits.

7. The A/D modulation apparatus of claim 1, wherein the input control module is a variable gain amplifier whose amplification rate is adjusted according to the modulation control bits.

8. The A/D modulation apparatus of claim 2, wherein the output control module comprises:
   a variable gain amplifier whose amplification rate is adjusted according to the modulation control bits; and
   a differentiator configured to perform high-pass filtering on an output signal of the variable gain amplifier according to a predetermined transfer function.

9. A method for modulating an analog signal into a digital signal in an Analog/Digital (A/D) modulation apparatus with a Nyquist structure, the method comprising:
   performing a modulation control bit output process of determining a modulation resolution that is needed in order to use a communication mode, and outputting modulation control bits to obtain the determined modulation resolution;

performing a basic input path control process of transferring or blocking an intermediate output signal of a basic loop, to which an initial analog signal is input, from among a plurality of unit loops having a structure in which the plurality of unit loops are extended by a serial connection, as an input signal of an extended loop serially connected to the basic loop, in response to the modulation control bits; and performing a final digital-modulated signal generation process of generating a final digital-modulated signal based on a final output signal of the basic loop and a final output signal of the extended loop.

10. The method of claim 9, further comprising performing a basic output path control process of transferring or blocking a final output signal of the extended loop in response to the modulation control bits in order to generate the final digital-modulated signal.

11. The method of claim 10, further comprising performing an internal path control process of enabling or disabling at least one of a plurality of integrators included in the extended loop, in response to the modulation control bits.

12. The method of claim 9, wherein each of the plurality of unit loops uses a second-order delta-sigma modulation technique.

13. The method of claim 12, wherein the intermediate output signal is a signal that is output by a last integration operation from among a plurality of integration operations performed in the basic loop that uses the second-order delta-sigma modulation technique.

14. The method of claim 10, further comprising:
performing an extended input path control process of transferring or blocking an intermediate output signal of an extended loop as an input signal of another extended loop, which is serially connected, in response to the modulation control bits;

performing an extended output path control process of transferring or blocking a final output signal of the other extended loop as an input signal of an output module in response to the modulation control bits; and performing an internal path control process of enabling or disabling at least one of a plurality of integrators included in the another extended loop in response to the modulation control bits.

15. The method of claim 9, wherein the basic or extended input path control process is a process of adjusting an amplification rate of a variable gain amplifier according to the modulation control bits.

16. The method of claim 10, wherein the basic output path control process or the extended output path control process is a process of adjusting an amplification rate of a variable gain amplifier according to the modulation control bits, and performing high-pass filtering on an output signal of the variable gain amplifier according to a predetermined transfer function.

17. The A/D modulation apparatus of claim 1, wherein the modulation control bits are determined according to the modulation resolution that is needed in order to use the communication mode.

18. The A/D modulation apparatus of claim 1, wherein the modulation resolution corresponds to a Signal to Noise Ratio (SNR) of the communication mode.

19. The method of claim 9, wherein the modulation control bits are determined according to the modulation resolution that is needed in order to use the communication mode.

20. The method of claim 9, wherein the modulation resolution corresponds to a Signal to Noise Ratio (SNR) of the communication mode.

* * * * *